US010356934B2

United States Patent
Ni et al.

(10) Patent No.: US 10,356,934 B2
(45) Date of Patent: Jul. 16, 2019

(54) SERVER RACK SYSTEM AND BIDIRECTIONAL POWER INLET

(71) Applicant: QUANTA COMPUTER INCORPORATED, Taoyuan (TW)

(72) Inventors: Hsiao-Tsu Ni, Taoyuan (TW); Yaw-Tzorng Tsorng, Taoyuan (TW); Chun Chang, Taoyuan (TW); Hsuan-Liang Liu, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 15/402,194

(22) Filed: Jan. 9, 2017

(65) Prior Publication Data

US 2018/0098455 A1   Apr. 5, 2018

Related U.S. Application Data

(60) Provisional application No. 62/402,314, filed on Sep. 30, 2016.

(51) Int. Cl.
*H05K 7/14* (2006.01)
*G06F 1/18* (2006.01)
(Continued)

(52) U.S. Cl.
CPC .......... *H05K 7/1492* (2013.01); *G06F 1/184* (2013.01); *G06F 1/187* (2013.01); *G06F 1/188* (2013.01); *G06F 1/20* (2013.01); *H05K 7/20754* (2013.01)

(58) Field of Classification Search
CPC .. H05K 7/1492; H05K 7/20754; G06F 1/184; G06F 1/187; G06F 1/188; G06F 1/20
See application file for complete search history.

(56) References Cited

U.S. PATENT DOCUMENTS

| | | | | |
|---|---|---|---|---|
| 5,761,033 A | * | 6/1998 | Wilhelm | ................ G06F 1/183 361/679.33 |
| 6,452,794 B1 | * | 9/2002 | Rumney | ................ G06F 1/182 323/259 |

(Continued)

FOREIGN PATENT DOCUMENTS

| | | |
|---|---|---|
| JP | 2014191821 A | 10/2014 |
| TW | M372611 U1 | 1/2010 |

(Continued)

OTHER PUBLICATIONS

TW Office Action for Application No. 106109168, dated Nov. 20, 2017, w/ First Office Action Summary.

(Continued)

*Primary Examiner* — Binh B Tran
*Assistant Examiner* — Douglas R Burtner
(74) *Attorney, Agent, or Firm* — Nixon Peabody LLP; Zhou Lu

(57) ABSTRACT

A server device is provided. The server device includes a chassis with a containing space, first and second openings. The first and second openings are located at two opposite ends of the containing space. The chassis includes a motherboard module in the containing space; a power-supply module disposed in the containing space, electrically connected to the motherboard module, and capable of plugging in and out from the chassis via the first opening, wherein the power-supply module comprises a first power port located in the first opening; a power port connector comprising a second power port located in the second opening, and configured to selectively connect to the first power port located in the first opening; and a storage array module, electrically connected to the motherboard module and the power-supply module.

12 Claims, 5 Drawing Sheets

(51) Int. Cl.
*G06F 1/20* (2006.01)
*H05K 7/20* (2006.01)

(56) References Cited

U.S. PATENT DOCUMENTS

| | | | | | |
|---|---|---|---|---|---|
| 8,363,414 | B2* | 1/2013 | Peng | ...................... | G06F 1/181 |
| | | | | | 312/223.1 |
| 8,400,765 | B2* | 3/2013 | Ross | .................. | H05K 7/20727 |
| | | | | | 361/679.33 |
| 8,787,014 | B2* | 7/2014 | Zhang | ...................... | G06F 1/20 |
| | | | | | 174/547 |
| 9,095,070 | B2* | 7/2015 | Ross | ...................... | G11B 33/128 |
| 9,629,265 | B2* | 4/2017 | Nagasaka | ............ | H05K 5/0213 |
| 9,679,275 | B2* | 6/2017 | Bruscoe | .................... | G06F 1/20 |
| 9,713,279 | B2* | 7/2017 | Tseng | .................. | H05K 7/1487 |
| 2010/0027213 | A1* | 2/2010 | Wu | .......................... | G06F 1/184 |
| | | | | | 361/679.39 |
| 2010/0110628 | A1 | 5/2010 | Barrenechea et al. | | |
| 2010/0271766 | A1* | 10/2010 | Lin | ......................... | G06F 1/184 |
| | | | | | 361/679.02 |
| 2011/0043994 | A1* | 2/2011 | Cheng | .................... | G06F 1/187 |
| | | | | | 361/679.33 |
| 2011/0261526 | A1* | 10/2011 | Atkins | ..................... | G06F 1/187 |
| | | | | | 361/679.33 |
| 2012/0218689 | A1* | 8/2012 | Peng | ................... | H05K 7/1492 |
| | | | | | 361/679.01 |
| 2013/0102237 | A1* | 4/2013 | Zhou | ....................... | G06F 1/189 |
| | | | | | 454/184 |
| 2014/0293523 | A1* | 10/2014 | Jau | ....................... | H05K 7/1492 |
| | | | | | 361/679.4 |
| 2015/0009622 | A1* | 1/2015 | Fukuda | ..................... | G06F 1/20 |
| | | | | | 361/679.47 |
| 2015/0208543 | A1* | 7/2015 | Chen | ................... | H05K 7/1489 |
| | | | | | 361/679.39 |
| 2016/0073544 | A1* | 3/2016 | Heyd | .................. | G11B 33/128 |
| | | | | | 361/679.31 |
| 2016/0128237 | A1* | 5/2016 | Szeremeta | ........... | G11B 33/128 |
| | | | | | 361/679.31 |
| 2017/0150635 | A1* | 5/2017 | Huang | ................. | H05K 7/1492 |
| 2017/0235348 | A1* | 8/2017 | Wolf | ........................ | G06F 1/20 |
| | | | | | 361/679.46 |

FOREIGN PATENT DOCUMENTS

| | | |
|---|---|---|
| TW | M432226 U1 | 6/2012 |
| TW | 201624473 A | 7/2016 |
| WO | 2016000415 A1 | 1/2016 |

OTHER PUBLICATIONS

Extended European Search Report for EP Application No. 17175301.5, dated Oct. 9, 2017.
JP Office Action for Application No. 2017-132857, dated Jul. 24, 2018, w/ First Office Action Summary.

\* cited by examiner

SERVER RACK SYSTEM AND BIDIRECTIONAL POWER INLET

FIELD OF THE INVENTION

The present invention relates to a server rack system and specifically to improvements that save time of maintenance and inspection and maximize the real estate of internal components.

BACKGROUND

In current server industry, a typical server rack generally includes multiple server devices, which may be pulled out from the front end of the server rack. Furthermore, the hard drives and user input interfaces are typically located towards the front of the server device, whereas the power inlets are located on the server device's rear side. Power cables of the server devices are respectively arranged to a rear end of the rack, and are exposed outwards from the rear end of the rack.

However, there is an increasing interest in providing flexibility in regards to mounting server components. This would require server components that allow for various installations. Unfortunately, a redesign of server components is not only expensive and time consuming, but sometimes not feasible. Therefore, it is a significant task to provide a design which may match the requirements above.

SUMMARY

One aspect of this disclosure is to provide a server rack and server devices that improve maintenance and service efficiency. Another aspect of this disclosure is to maximize the space of each server component. The conveniences of sever operating, component replacing, taking out modules, or removing wires may be improved such that cost and time are saved.

Embodiments of the invention concern a chassis having a containing space, a first opening and a second opening, wherein the first opening and the second opening are located at two opposite ends of the containing space. The server device also includes a motherboard module disposed in the containing space of the chassis. The server device also includes a power-supply module disposed in the containing space of the chassis, electrically connected to the motherboard module, and capable of plugging in and out from the chassis via the first opening. The power-supply module comprises a first power port located in the first opening. The server device also includes a power port connector comprising a second power port located in the second opening and configured to selectively connect to the first power port located in the first opening. The server device also includes a storage array module electrically connected to the motherboard module and the power-supply module. In an exemplary embodiment, the storage array module can include a plurality of storage arrays each capable of plugging in and out from the chassis via the first opening.

In an exemplary embodiment of the invention, the server device can also include a plurality of input/output interface elements disposed on the motherboard module, wherein all of the input/output interface elements are disposed in the second opening.

DETAILED DESCRIPTION

Figure 1:
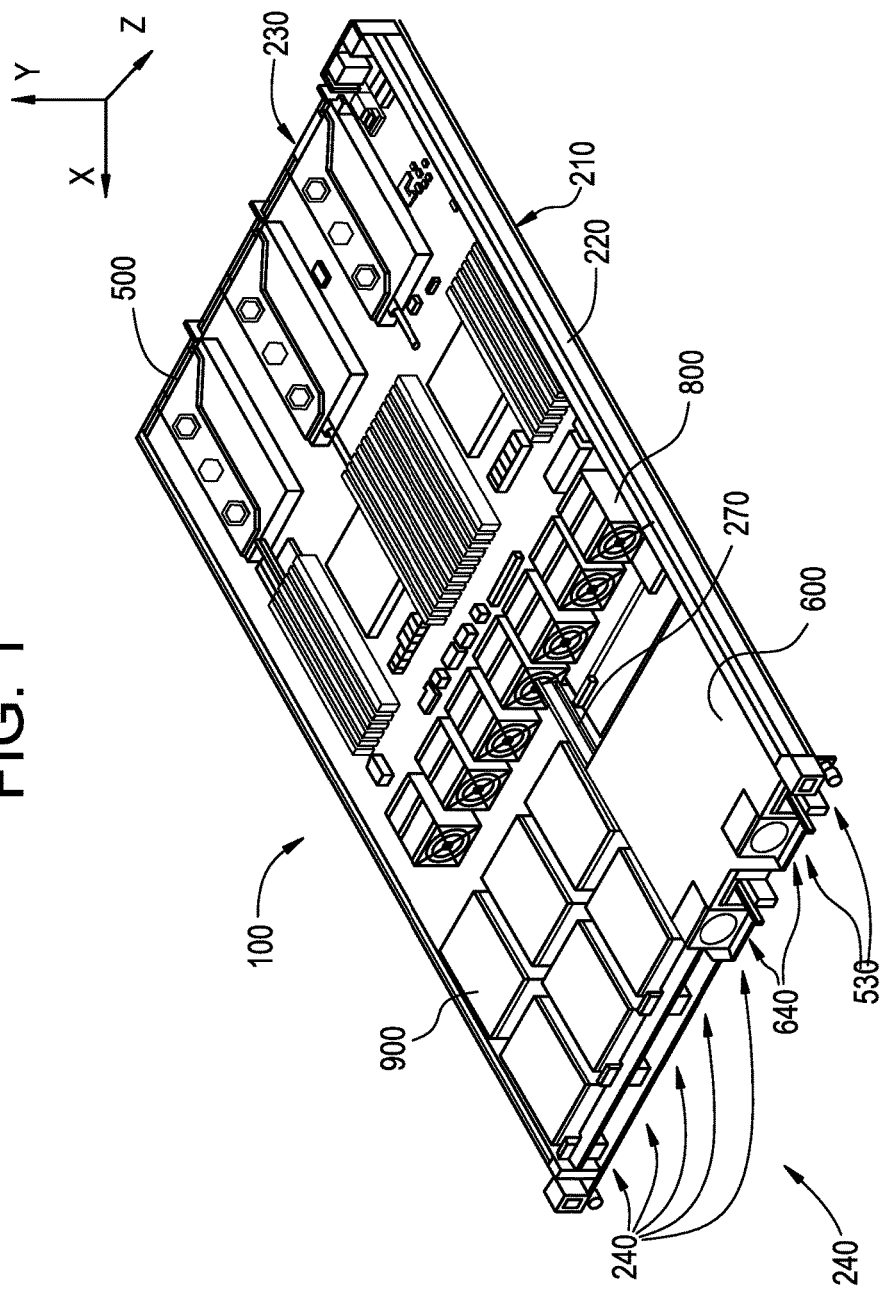
FIG. 1 is a top isometric view of a server device viewed from a second opening of the chassis in accordance with some embodiments of the invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

FIG. 1 is a top isometric view of a server device 100. In some embodiments, the server device 100 can include a chassis 210, a motherboard module 500, a plurality of power-supply modules 600, a plurality of fan modules 800 and a storage array module 900.

Figure 2:
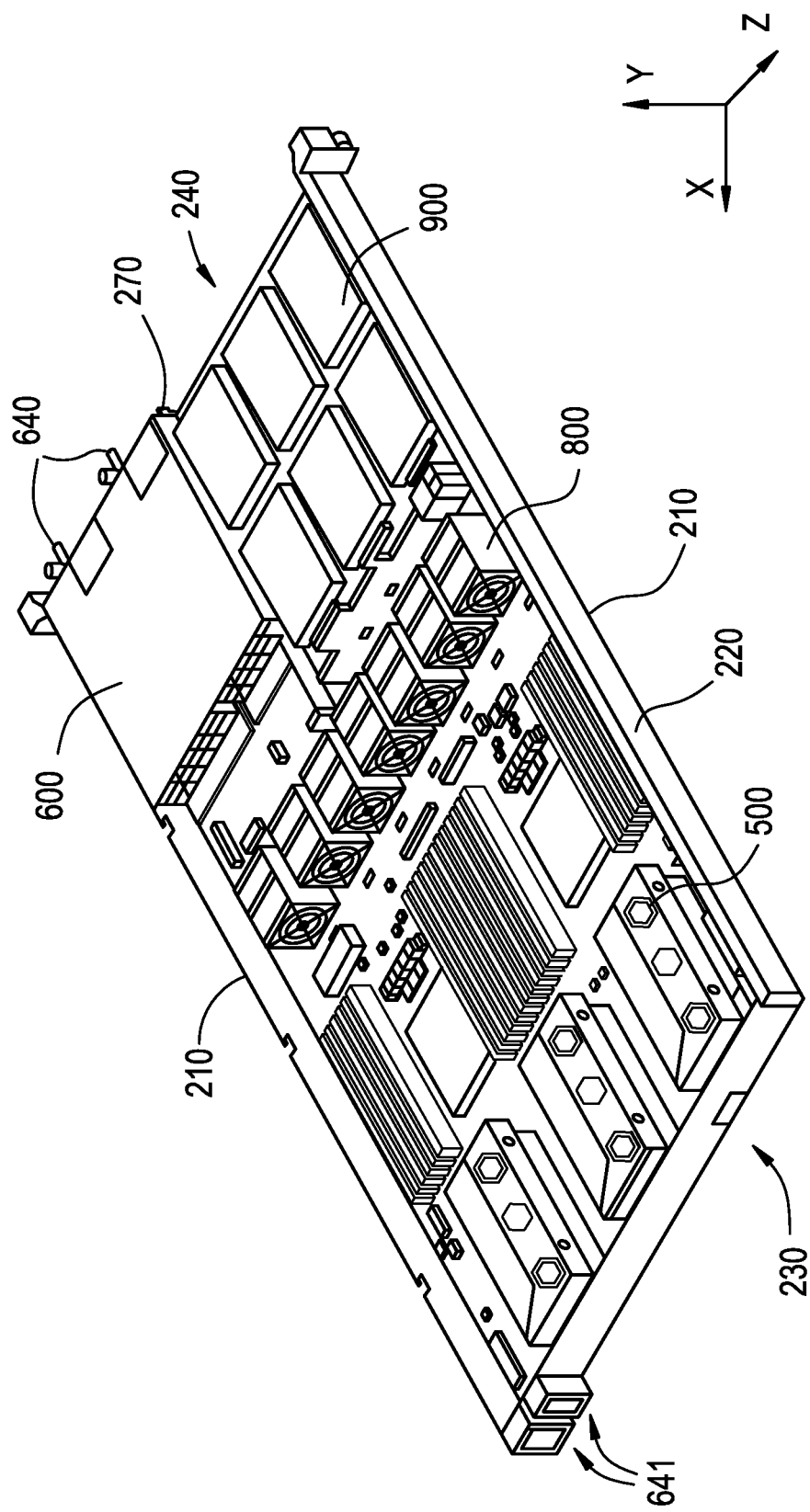
FIG. 2 is a top isometric view of the server device viewed from the first opening of the chassis in accordance with some embodiments of the invention.

In some embodiments, the chassis 210 is formed in the shape of a cuboid and mounted in a rack (not shown for simplicity). The chassis 210 has a containing space 220, a first end or opening 230 and a second end or opening 240, wherein the first opening 230 and the second opening 240 are located at two opposite ends of the containing space 220. The containing space 220 is connected to the outer space of the chassis 210 through the first opening 230 and the second opening 240. FIG. 1 is a top isometric view of a server device 100 viewed from the second opening 240 in accordance with some embodiments of the invention. FIG. 2 is a top isometric view of a server device 100 viewed from the first opening 230 in accordance with some embodiments of the invention.

The motherboard module 500 is disposed in the containing space 220 and is located at the first opening 230. The motherboard module 500 can be configured to be inserted within the chassis 210 along the x axis via the first opening 230. In some embodiments, the motherboard module 500 is capable of plugging into the chassis 210 along the Y axis or plugged out from the chassis 210 via the first opening 230. The plurality of power-supply modules 600 is disposed in the containing space 220 and is located at second opening 240. The plurality of power-supply modules 600 is configured to be inserted within the chassis 210 along the x axis via the second opening 240. The plurality of power-supply modules 600 is capable of plugging into the chassis 210 along the Y axis or plugged out from the chassis 210 via the second opening 240. The plurality of power-supply modules 600 is electrically connected to the motherboard module 500.

The storage array module 900 is disposed in the containing space 220 and is located at the second opening 240. The storage array module 900 is configured to be inserted within the chassis 210 along the x axis via the second opening 240. The storage array module storage array module 900 is capable of plugging into the chassis 210 along the Y axis or plugged out from the chassis 210 via the second opening 240. The storage array module 900 is electrically connected to the motherboard module 500 and the plurality of power-supply modules 600.

As shown in FIGS. 1 and 2, the plurality of fan modules 800 is disposed in the containing space 220 in a row and is located near the second opening 240. The plurality of fan modules 800 is configured to be inserted within the chassis 210 along the x axis via the second opening 240. The plurality of fan modules 800 is capable of plugging into the chassis 210 along the Y axis or plugged out from the chassis 210 via the first or second openings 230, 240. The plurality of fan modules 800 is electrically connected to the plurality of power-supply modules 600. In another embodiment of the invention, the plurality of fan modules 800 is disposed in the center of the containing space 220 in a row. The fan modules 800 are utilized to enhance the air convection across the containing space 220 from the first opening 230 to the second opening 240. It should be realized that the plurality of fan modules 800 can include any number of fans or orientated in any manner. The orientation mentioned above is only for example, and not to limit this disclosure. The person having ordinary knowledge in the art may flexibly select any number of fans or orientation in accordance with the disclosure.

The server device 100 can also include a plurality of input/output interface elements 530. The input/output interface elements 530 are disposed on the motherboard module 500 and are electrically connected to input/output modules within the motherboard module 500. All of the input/output interface elements 530 are disposed in the first opening 230. For example, the input/output interface elements 530 can be exposed outside the chassis 210 from the first opening 230 or not exposed so that the signal wires (not shown) which are plugged into portion or all of the input/output interface elements 530 may extend outside the chassis 210 from the second opening 240. The input/output interface elements 530, for example, can be a display port, a network port or a USB port and so on.

Figure 3:
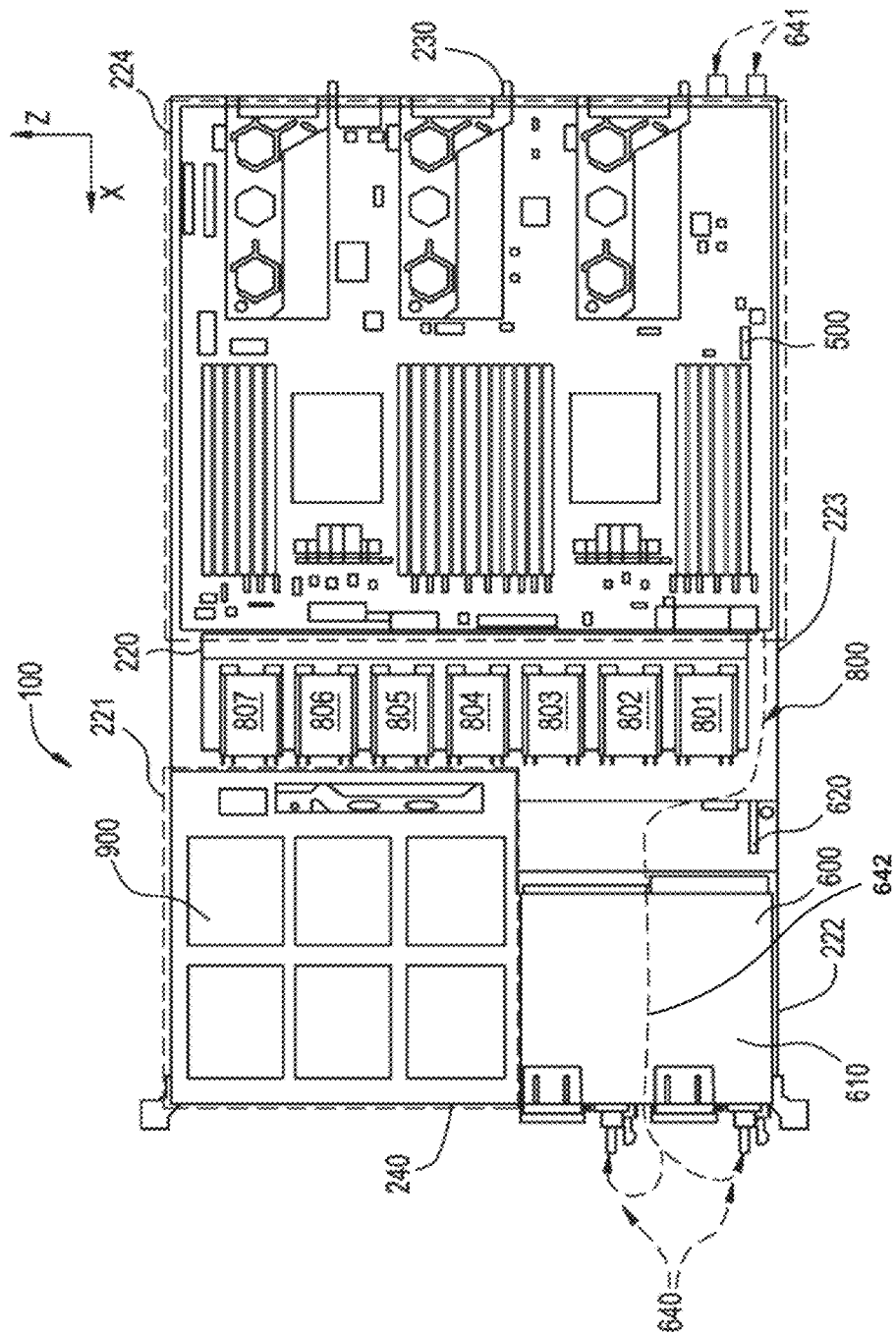
FIG. 3 is a top view of the server device accordance with some embodiments of the invention.

Referring now to FIG. 3, the containing space 220 of the chassis 210 can include a first accommodating space 221, a second accommodating space 222, a third accommodating space 223, and a fourth accommodating space 224. In some embodiments of the invention, the motherboard module 500 is located in the fourth accommodating space 224, the plurality of power-supply modules 600 is located in the second accommodating space 222, the plurality of fan modules 800 is located in the third accommodating space 223, and the storage array module 900 is located in the first accommodating space 221.

In this embodiment, the storage array module 900 and the plurality of power-supply modules 600 are disposed in parallel in the containing space 220 so that each of them may be detached from the chassis 210 independently. Both the storage array module 900 and the plurality of power-supply modules 600 are separated by a splitting plate 270. The splitting plate 270 is designed to separate the storage array module 900 and the plurality of power-supply modules 600.

The splitting plate 270 can be attached to the chassis 210. In addition, the splitting plate 270 can be made of sheet metal using conventional metal fabrication techniques such as bending, forming, and stamping. As a result, the splitting plate 270 can be made very inexpensively. Furthermore, the motherboard module 500 and the storage array module 900 are disposed opposite of one another in the containing space 220 so that each of them may be detached from the chassis 210 independently, and to maximize the real estate for both modules.

The plurality of power-supply modules 600 includes at least two power supply units 601, 602, a first power port 640 located in the second opening 240 and a second power port 641 located in the first opening 230. Both power ports 640, 641 are configured to provide the power supply units 601, 602 with bi-directional power from multiple access points. The first and second power ports 640, 641 are connected by power port connector 642 (FIG. 3). The second power port 641 can connect to the first power port 640 by power port connector 642 such that plurality of power-supply modules 600 can receive power from power lines at the first opening 230. The power port connector 642 can run beneath or along the edge of the motherboard module 500 in the fourth accommodating space 224, around the plurality of fan modules 800 in the third accommodating space 223, and over the plurality of power-supply modules 600 in the second accommodating space 222 until it reaches the first power port 640 located in the second opening 240.

Moreover, the first power port 640 may be exposed outside the chassis 210 from the second opening 240 or not exposed so that the power line which is connected to the first power port 640 via the second power port 641 can extend outside the chassis 210 from the first opening 230. Therefore, in configurations where the chassis receives power from the rear, an AC input can be plugged into the rear side of the chassis as a result of the power cord inside the chassis that connects and goes through the inlet chassis to the front side. Alternatively, if the chassis is designed to power the chassis from the front side, an AC input can be plugged into the PSU directly. In other words, the chassis can be powered via bidirectional power inlet.

Therefore, according to the design above, before the server device 100 is maintained or surveyed, the technician can proceed operating, replacing, plugging out or removing the signal wires which are plugged into portion or all of the input/output interface elements 530 and the power line which is plugged into the first and second power ports 640, 641 for the sever device 100 from the nearest opening (230 or 240). Because it is not necessary to reposition around the server device 100 or the server rack (not pictured), to disassemble or service the server device 100, time is saved. In addition, because the chassis provides this flexibility, mounting server components is accomplished regardless of their orientation within the chassis.

The plurality of power-supply modules 600 can include a housing 610, a power control board 620, and power fans 801, 802, and 803 of the plurality of fan modules 800, and a plurality of power related components (not shown). The housing 610 is slidable in the second accommodating space 222 of the containing space 220. The power related components are disposed in the housing. This power related components can include, for example, a frequency booster, a frequency reducer, or a AC/DC converter and the like. The power control board 620 is utilized to control the quantity of power output (voltage or current) by controlling the power related components. The first power port 640 is disposed on one end of the housing and, for example, exposed outside the housing 610. The first power port 640 is electrically coupled to the power control board 620, the power fans 801, 802, and 803 and the power related components. The second power port 641 is disposed on one end of the motherboard module 500 and, for example, exposed outside the chassis 210 from the first opening 230. The second power port 641 is electrically coupled to the power control board 620, the power fans 801, 802, and 803 and the power related components directly or via the first power port 640. The power fans 801, 802, and 803 are utilized to provide air convection and to dissipate the heat in the housing 610 and across a portion of the motherboard module 500.

Figure 4:
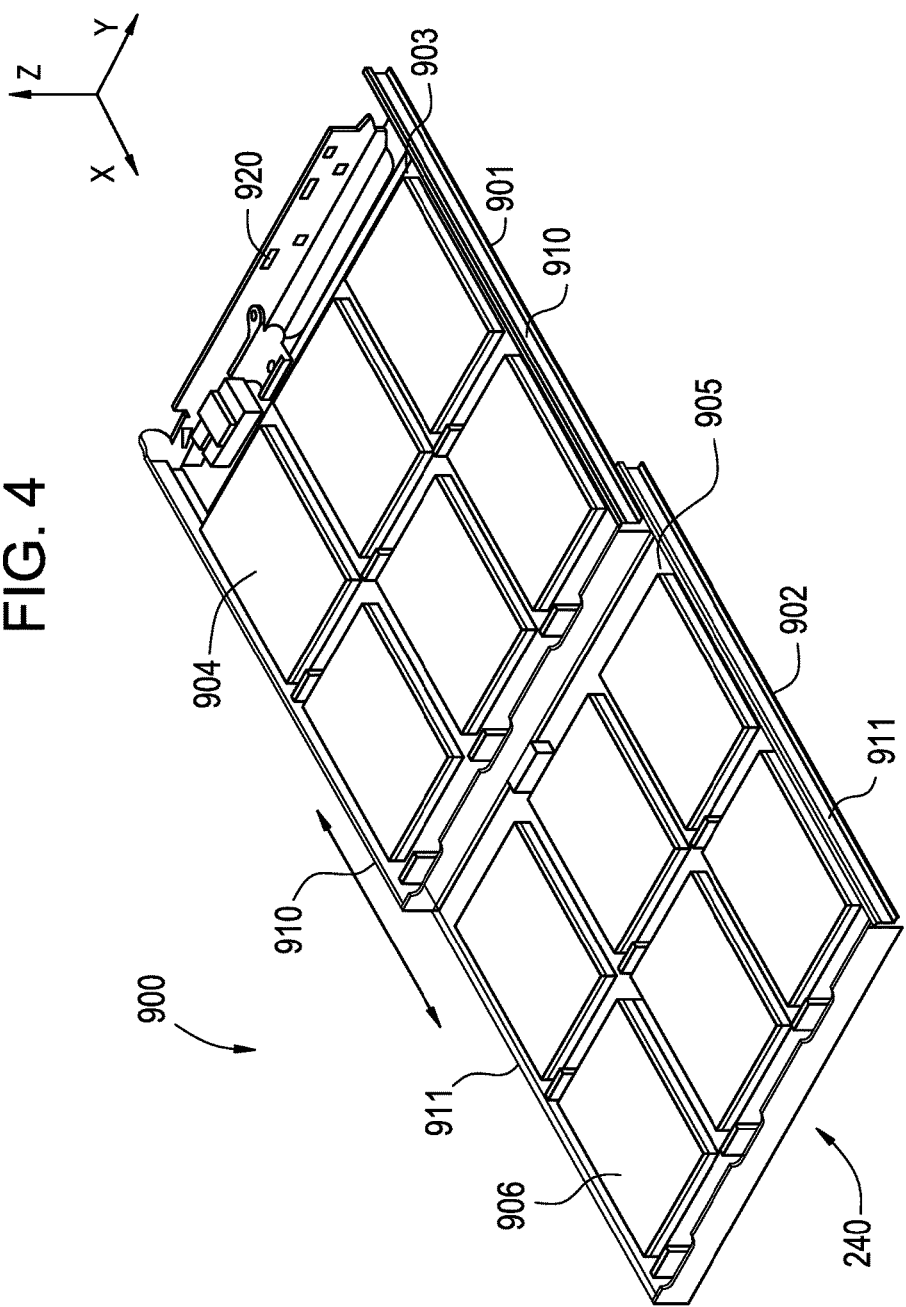
FIG. 4 top isometric view of the plurality of drive module viewed from the first opening in accordance with some embodiments of the invention.

Referring to FIG. 4, the storage array module 900 is slidable in the first accommodating space 221. The storage array module 900 can be pushed in or pulled out from the chassis 210 through the second opening 240. The storage array module 900 includes a first tray 901 and a second tray 902 for storage arrays. The first tray 901 carries the first storage arrays 903. The second tray 902 carries the second storage arrays 905. Both the first and second storage arrays 903, 905 contain plurality of disk devices 904, 906. The plurality of disk devices can include hard disk drive, solid state disk drives, or a combination thereof. Furthermore, for the purpose of this invention, the plurality of disk devices can include other drive technology not detailed herein.

The storage array module 900 further includes a first guide rail 910, and a second guide rail 911. Specifically, the first tray 901 can include the first guide rail 910 and the second tray 902 can include the second guide rail 911. Both guide rails are mechanically connected to enable the first and second trays 901, 902 to functionally slide in the first accommodating space 221 of the containing space 220 with respect to one another.

Moreover, in order to detach the storage array module 900 from the chassis 210 more easily, the first and second tray 901, 902 are slidably detachable in the direction of the second opening 240. Furthermore, the first tray 901 is slidably detachable independent of the second tray 902. Thus, when the storage array module 900 is pushed into the chassis 210 a technician can service the plurality of disk devices 904 of the first tray 901 without removing the second tray 902.

The storage array module 900 includes a storage array backplane board 920. The plurality of disk devices 904 are arranged in an array and stacked on the first tray 901. The plurality of disk devices 906 are arranged in an array and stacked on the second tray 902. In more detail, each of the disk devices includes a disk and a disk slot. The disk is disposed in the disk slot and is detachable. The disk is electrically connected to the storage array backplane board 920 through a connector (not shown) in the disk slot. Therefore, the disk can be replaced as required. Moreover, both the plurality of disk devices 904, 906 are electrically coupled to the motherboard module 500 through a storage array backplane board 920.

It should be realized that the quantities of the storage trays (e.g. two) and the plurality of disk devices (e.g. twelve) mentioned above are only for example, and not to limit this disclosure. The person having ordinary knowledge in the art may flexibly select any proper quantity of storage arrays according to the requirement.

Figure 5:
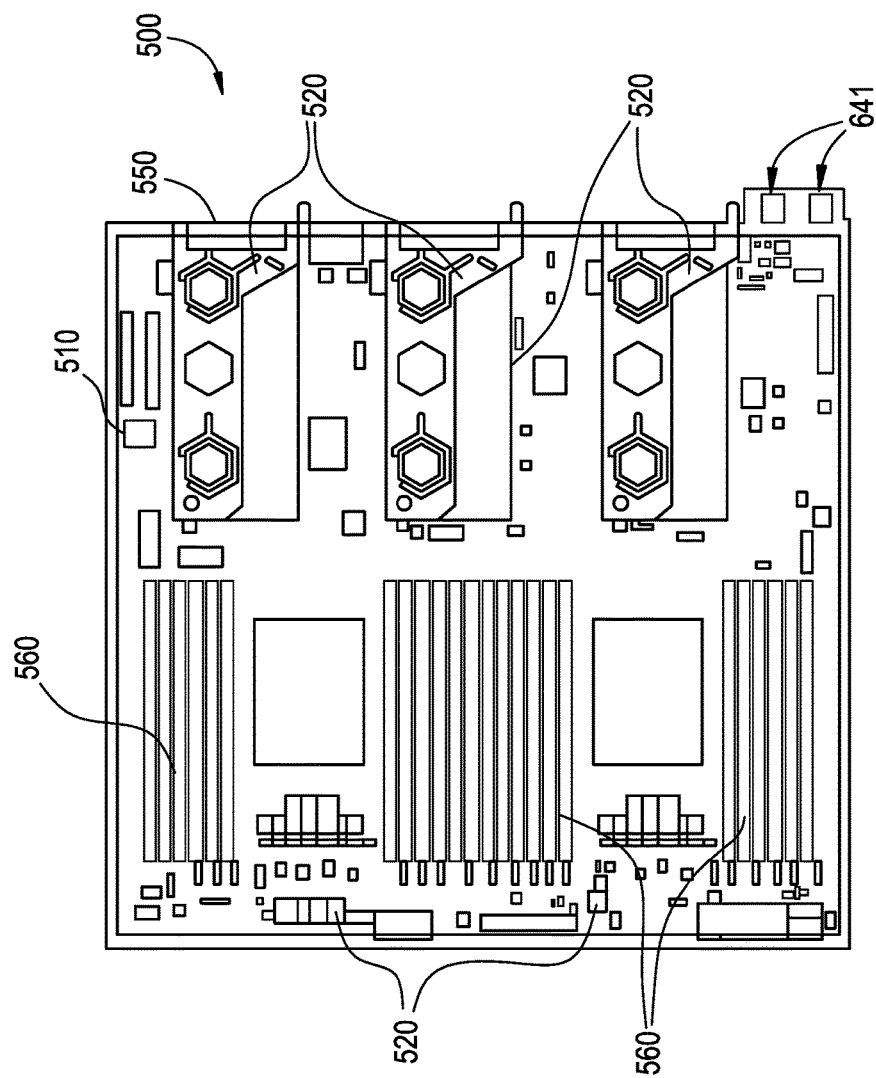
FIG. 5 top view of the motherboard module in accordance with some embodiments of the invention.

Referring to FIG. 5, the motherboard module 500 includes a motherboard tray 550, a motherboard 510, a plurality of electronic components 520, a plurality of input/output modules 521, and a plurality of thermal fins 560. The motherboard tray 550 is slidable in the fourth accommodating space 224 and carries the motherboard 510. The plurality of electronic components 520 is disposed on the motherboard 510. For example, the plurality of electronic components 520 can include a Center Processing Unit (CPU), a Graphic Processing Unit (GPU), a communication interface unit, a disk unit or plural memory units. The plurality of input/output modules 521 is electrically connected to the corresponding plurality of input/output interface elements 530. The plurality of electronic components 520 is electrically connected to the motherboard 510. The thermal fins 560 are attached on the CPU.

In some embodiments, when the motherboard module 500 is plugged into the chassis 210 along the x axis, the motherboard tray 550 is disposed in the in the fourth accommodating space 224 of the containing space 220 and restricted between the plurality of fan modules 800 and the first opening 230. Accordingly, the motherboard tray 550 is restricted not to move along the x axis. Furthermore, the side motherboard tray 550 meets the sides of the chassis 220 to restrict movement along the z axis.

To sum up, according to the server rack and the design of the server devices in this disclosure, before the server devices are maintained or surveyed, the technician can remove the signal wires of the input/output interface elements and the power lines of the power port from the first and second opening easily. Because it is not necessary to moving to either end of the server device or to disassemble the server device in order to remove the wires, the time of maintenance and inspection is saved. Furthermore, because the motherboard module and the storage array module are disposed opposite of one another, they can be detached from the chassis independently, and the real estate is maximized for both.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A server device, comprising:
   a chassis having a containing space, a first opening and a second opening, wherein the first opening and the second opening are located at two opposite ends of the containing space;
   a motherboard module disposed in the containing space;
   a power-supply module disposed in the containing space, electrically connected to the motherboard module, and capable of plugging in and out from the chassis via the second opening, wherein the power-supply module comprises a first power port located in the second opening;
   a power port connector comprising a second power port located in the first opening, the second power port configured to connect to the first power port located in the second opening via a power port connector such that the power-supply module receives power via the second power port, wherein the power port connector runs beneath the motherboard module;
   a storage array module, electrically connected to the motherboard module and the power-supply module.

2. The server device of claim 1, wherein the chassis further comprises:
   a plurality of input/output interface elements disposed in the first opening.

3. The server device of claim 1, wherein the storage array module comprises a plurality of storage arrays, and wherein the plurality of storage arrays comprises:
   a first storage rack comprising a first plurality of disk devices, the first storage rack including a first guide rail; and
   a second storage rack comprising a second plurality of disk devices, the second storage rack including a second guide rail mechanically coupled to the first guide rail,
   wherein the first and the second storage racks are configured to slide independent of one another in and out from the chassis via the second opening.

4. The server device of claim 3, wherein the first and the second storage racks are slidably detachable from one another.

5. The server device of claim 3, wherein the first and second plurality of disk devices are electrically coupled to the motherboard module through a storage array back board.

6. The server device of claim 1, wherein the motherboard module comprises:
   a tray slidable in and out of the first opening.

7. The server device of claim 1, further comprising:
   an input/output interface elements, and
   passed through the second opening from the chassis.

8. The server device of claim 1 wherein the storage array module comprises a plurality of storage arrays each capable of plugging in and out from the chassis via the second opening.

9. A server device, comprising:
   a chassis having a containing space, a first opening and a second opening, wherein the first opening and the second opening are located at two opposite ends of the containing space, wherein the containing space comprises a first accommodating space, a second accommodating space, a third accommodating space, and a fourth accommodating space;
   a motherboard module disposed in the fourth accommodating space of the containing space, wherein the motherboard module comprises a motherboard, a plurality of electronic components disposed on the motherboard, and a tray slidable in and out of the first opening carrying the motherboard;
   a power-supply module disposed in the second accommodating space of the containing space, electrically connected to the motherboard module, and capable of plugging in and out from the chassis via the second opening, wherein the power-supply module comprises a first power port located in the second opening;
   a power port connector comprising a second power port located in the first opening, the second power port configured to connect to the first power port located in the second opening via a power port connector such that the power-supply module receives power via the second power port, wherein the power port connector runs beneath the motherboard module;
   a plurality of fan modules disposed in the third accommodating space of the containing space, wherein the plurality of fan modules is electrically connected to the power-supply module, and capable of plugging in and out from the chassis via the second opening; and
   a storage array module disposed in the first accommodating space of the containing space, electrically connected to the motherboard module and the power-supply module, the storage array module comprising a plurality of storage arrays, wherein the plurality of storage arrays comprises a first storage rack comprising a first plurality of disk devices, the first storage rack including a first guide rail; and a second storage rack comprising a second plurality of disk devices, the second storage rack including a second guide rail mechanically coupled to the first guide rail, wherein the first and the second storage racks are configured to slide independent of one another in and out from the chassis via the second opening.

10. The server device of claim 1, wherein the containing space comprises a first accommodating space, a second accommodating space, a third accommodating space, and a fourth accommodating, wherein the server device further comprises a plurality of storage modules disposed in the first accommodating space and a plurality of fan modules disposed in the third accommodating space, wherein the power-supply module is disposed in the second accommodating space, and the motherboard module is disposed in the fourth accommodating space.

11. The server device of claim 10, wherein the third accommodating space is sandwiched between the fourth accommodating space and the first accommodating space.

12. The server device of claim 11, wherein the third accommodating space is further sandwiched between the fourth accommodating space and the second accommodating space.

* * * * *